United States Patent
Bertran et al.

(10) Patent No.: US 9,588,863 B2
(45) Date of Patent: *Mar. 7, 2017

(54) GENERATION AND APPLICATION OF STRESSMARKS IN A COMPUTER SYSTEM

(71) Applicant: International Business Machines Corporation, Armonk, NY (US)

(72) Inventors: Ramon Bertran, Bronx, NY (US); Pradip Bose, Yorktown Heights, NY (US); Alper Buyuktosunoglu, White Plains, NY (US); Timothy J. Slegel, Staatsburg, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 91 days.

This patent is subject to a terminal disclaimer.

(21) Appl. No.: 14/519,342

(22) Filed: Oct. 21, 2014

(65) Prior Publication Data

US 2016/0110276 A1    Apr. 21, 2016

(51) Int. Cl.
*G06F 17/50* (2006.01)
*G06F 11/00* (2006.01)
(Continued)

(52) U.S. Cl.
CPC ...... *G06F 11/3024* (2013.01); *G06F 11/3428* (2013.01); *G01R 31/28* (2013.01);
(Continued)

(58) Field of Classification Search
CPC .. G06F 17/5009; G06F 17/5022; G06F 11/00; G06F 13/10; G06F 13/12;
(Continued)

(56) References Cited

U.S. PATENT DOCUMENTS

| 5,941,991 A | 8/1999 | Kageshima |
| 6,988,183 B1 | 1/2006 | Wong |

(Continued)

OTHER PUBLICATIONS

List of IBM Patents or Patent Applications Treated as Related; Jul. 15, 2015, 2 pages, (Appendex P).

(Continued)

*Primary Examiner* — Phallaka Kik
(74) *Attorney, Agent, or Firm* — Cantor Colburn LLP; Margaret A. McNamara

(57) ABSTRACT

One aspect is a method that includes analyzing, by a processor of an analysis system, an instruction set architecture of a targeted complex-instruction set computer (CISC) processor to generate an instruction set profile for each CISC architectural instruction variant of the instruction set architecture. A combination of instruction sequences for the targeted CISC processor is determined from the instruction set profile that corresponds to a desired stressmark type. The desired stressmark type defines a metric representative of functionality of interest of the targeted CISC processor. Performance of the targeted CISC processor is monitored with respect to the desired stressmark type while executing each of the instruction sequences. One of the instruction sequences is identified as most closely aligning with the desired stressmark type based on performance results of execution of the instruction sequences with respect to the desired stressmark type.

10 Claims, 9 Drawing Sheets

(51) Int. Cl.

| | | |
|---|---|---|
| *G06F 13/00* | (2006.01) | |
| *G06F 9/45* | (2006.01) | |
| *G01R 31/28* | (2006.01) | |
| *G06F 11/30* | (2006.01) | |
| *G06F 11/34* | (2006.01) | |
| *G06F 9/455* | (2006.01) | |
| *G06F 13/10* | (2006.01) | |
| *G06F 13/12* | (2006.01) | |

(52) U.S. Cl.
CPC ............ *G06F 9/455* (2013.01); *G06F 13/10* (2013.01); *G06F 13/12* (2013.01); *G06F 17/5009* (2013.01); *G06F 17/5022* (2013.01)

(58) Field of Classification Search
CPC ........ G06F 9/455; G06F 9/45; G06F 11/3024; G06F 11/3428; G01R 31/28
USPC .......... 716/106, 136; 703/20, 16, 21, 22, 26; 714/39, 47.2, 47.3, 732
See application file for complete search history.

(56) References Cited

U.S. PATENT DOCUMENTS

| | | | |
|---|---|---|---|
| 7,865,747 B2 | 1/2011 | Buyuktosunoglu et al. | |
| 8,103,856 B2 | 1/2012 | Balasubramonian et al. | |
| 8,532,974 B2 | 9/2013 | Guo et al. | |
| 2008/0115028 A1 | 5/2008 | Homer et al. | |
| 2011/0296149 A1* | 12/2011 | Carter | G06F 1/3203 712/229 |
| 2012/0173907 A1 | 7/2012 | Moses et al. | |
| 2013/0339975 A1* | 12/2013 | Busaba | G06F 9/44 718/104 |
| 2016/0110197 A1* | 4/2016 | Bertran | G06F 11/3428 712/228 |
| 2016/0110198 A1* | 4/2016 | Bertran | G06F 11/3024 712/228 |
| 2016/0110278 A1* | 4/2016 | Bertran | G06F 11/3428 714/47.2 |

OTHER PUBLICATIONS

U.S. Appl. No. 14/743,104, filed Jun. 18, 2015, Entitled: Processor Stressmarks Generation, First Named Inventor: Ramon Beltran.
List of IBM Patents or Patent Applications Treated as Related, Aug. 21, 2015, 2 pages, (Appendix P).
U.S. Appl. No. 14/830,819, filed Aug. 20, 2015, Entitled: "Generation and Application of Stressmarks in a Computer System," First Named Inventor: Ramon Bertran.
U.S. Appl. No. 14/519,329, filed Oct. 21, 2014, Entitled: Processor Stressmarks Generation, First Named Inventor: Ramon Bertran.
U.S. Appl. No. 14/743,104, filed Jun. 18, 2015, Entitled: Processor Stressmarks Generation, First Named Inventor: Ramon Bertran.
A. Joshi, et al, Automated Microprocessor Stressmark Generation, IEEE 14th International Symposium on High Performance Computer Architecture, HPCA, Feb. 2008, pp. 229-239.
K. Ganesan et al., Maximum Multicore POwer (MAMPO)—An Automatic Multithreaded Synthetic Power Virus Generation Framework for Multicore Systems, SC11, Nov. 2011, pp. 1-12.
K. Ganesan, et al., System-level Max Power (SYMPO)—A Systematic Approach for Escalating System-level Power Consumption using Synthetic Benchmarks, PACT '10, Sep. 2010, pp. 19-18.
List of IBM Patents or Patent Applications Treated as Related; Oct. 22, 2014, 2 pages, (Appendix P).
M. Ketkar et al., A Microarchitecture-based Framework for Pre-and Post-Silicon Power Delivery Analysis, MICRO '09, Dec. 2009, 10 pages.
R. Bertran, et al., Systematic Energy Characterization of CMP/SMT Processor Systems via Automated Micro-Benchmarks, 2012 IEEE/ACM 45th Annual International Symposium on Microarchitecture (MICRO), Dec. 2012, pp. 199-211.
S. Polfliet et al., Automated Full-System Power Characterization, IEEE Computer Society, May/Jun. 2011, 14 pages.
V. Tiwari, et al., Power Analysis of Embedded Software: A First Step Towards Software Power Minimization, IEEE Transactions on Very Large Scale Integration (VLSI) Systems, vol. 2, No. 4, Nov. 1994, pp. 437-445.
Y. Kim, AUDIT: Stress Testing the Automatic Way, MICRO '12, Dec. 2012, pp. 212-223.
Y. Kim, et al., Automated di/dt Stressmark Generation for Microprocessor Power Delivery Networks, International Symposium on Low Power Electronics and Design (ISLPED), Aug. 2011, pp. 253-258.
Y. Shao et al., Energy Characterization and Instruction-Level Energy Model of Intel's Xeon Phi Processor, ISLPED '13, Sep. 2013, 6 pages.
List of IBM Patents or Patent Applications Treated as Related; Jan. 24, 2017, 2 pages.
U.S. Appl. No. 15/412,361 filed Jan. 23, 2017, Entitled: "Generation and Application of Stressmarks in a Computer System," First Named Inventor: Ramon Bertran.

* cited by examiner

GENERATION AND APPLICATION OF STRESSMARKS IN A COMPUTER SYSTEM

BACKGROUND

The present application relates generally to computer system performance analysis. More specifically, the present application is directed to generation and application of stressmarks in a computer system.

In computer system design, understanding of energy behavior and microarchitecture characteristics early in a design process can enable designers to make packaging and power delivery decisions. Further optimizations to a design can be made to effectively manage heat and potential noise issues associated with different stressmarks. A stressmark refers to a condition or set of conditions that puts a desired type of stress on a system, such as a low power condition, a high power condition, a high inductive noise condition, and the like. For example, a particular instruction or sequence of instructions can result in a maximum condition for a metric of interest, a minimum for a metric of interest, or a maximum rate of change of a metric of interest. Analysis can be performed at a core or module level, at a processor level, at a system level, etc.

When system performance analysis is attempted manually, the process is typically tedious, time-consuming, and error-prone. Due to the vast number of possibilities within a system, manual analysis is unable to fully explore a solution-space. For instance, in a complex instruction set computer (CISC), a large number of complex instructions may exist that each have a number of variations. Systems that apply a generic or brute-force approach to system analysis are typically constrained by execution time due to the large number of possible configurations and permutations. Expert-defined design spaces can reduce system analysis computational burden but typically require substantial manual intervention as well as substantial effort by experts to study the system in great detail. At a system level, complexity further increases as multiple workloads loads can be run using different resources within the system at the same time.

SUMMARY

Embodiments relate to generation and application of stressmarks in a computer system. One aspect is a method that includes analyzing, by a processor of an analysis system, an instruction set architecture of a targeted complex-instruction set computer (CISC) processor to generate an instruction set profile for each CISC architectural instruction variant of the instruction set architecture. A combination of instruction sequences for the targeted CISC processor is determined from the instruction set profile that corresponds to a desired stressmark type. The desired stressmark type defines a metric representative of functionality of interest of the targeted CISC processor. Performance of the targeted CISC processor is monitored with respect to the desired stressmark type while executing each of the instruction sequences. One of the instruction sequences is identified as most closely aligning with the desired stressmark type based on performance results of execution of the instruction sequences with respect to the desired stressmark type.

Embodiments also include a computer system with a memory that includes a definition of an instruction set architecture of a targeted CISC processor. The computer system also includes a processor operably coupled to the memory and configured to perform a method. The method includes analyzing the instruction set architecture of the targeted CISC processor to generate an instruction set profile for each CISC architectural instruction variant of the instruction set architecture. A combination of instruction sequences for the targeted CISC processor is determined from the instruction set profile that corresponds to a desired stressmark type. The desired stressmark type defines a metric representative of functionality of interest of the targeted CISC processor. Performance of the targeted CISC processor is monitored with respect to the desired stressmark type while executing each of the instruction sequences. One of the instruction sequences is identified as most closely aligning with the desired stressmark type based on performance results of execution of the instruction sequences with respect to the desired stressmark type.

Embodiments also include a computer program product. The computer program product includes a computer readable storage medium having computer readable program code embodied therewith. The computer readable program code is configured for analyzing, by a processor of an analysis system, an instruction set architecture of a targeted CISC processor to generate an instruction set profile for each CISC architectural instruction variant of the instruction set architecture. A combination of instruction sequences for the targeted CISC processor is determined from the instruction set profile that corresponds to a desired stressmark type. The desired stressmark type defines a metric representative of functionality of interest of the targeted CISC processor. Performance of the targeted CISC processor is monitored with respect to the desired stressmark type while executing each of the instruction sequences. One of the instruction sequences is identified as most closely aligning with the desired stressmark type based on performance results of execution of the instruction sequences with respect to the desired stressmark type.

A further embodiment is a method that includes defining, by a processor of an analysis system, a set of workloads for a targeted multi-core computer system based on a plurality of metrics of interest to profile. A plurality of workload-to-core mappings is generated for the workloads on the targeted multi-core computer system. The workloads run on the targeted multi-core computer system based on the workload-to-core mappings to produce a mapping of the workloads to the metrics of interest as experimental data. A statistical analysis is applied on the experimental data to define a plurality of metric profiles for the targeted multi-core computer system.

An additional embodiment is a computer system that includes a memory having a workload database and a mapping database. The computer system also includes a processor operably coupled to the memory and configured to perform a method. The method includes defining a set of workloads in the workload database for a targeted multi-core computer system based on a plurality of metrics of interest to profile. A plurality of workload-to-core mappings is generated in the mapping database for the workloads on the targeted multi-core computer system. Running of the workloads on the targeted multi-core computer system is initiated based on the workload-to-core mappings to produce a mapping of the workloads to the metrics of interest as experimental data. A statistical analysis is applied on the experimental data to define a plurality of metric profiles for the targeted multi-core computer system.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments include systems, methods and computer program products for generation and application of stressmarks in a computer system. Stressmark analysis can be performed at a core level, a processor level, and/or a system level. In exemplary embodiments, a complete energy-wise and microarchitecture-wise taxonomy is generated for a complex-instruction set computer (CISC) processor that includes instruction-wise power and instructions-per-cycle formalisms of each instruction variant present in an instruction set architecture for a CISC architecture. In a CISC architecture, each instruction can be decomposed into a number of micro-operations that may access memory and/or multiple functional units per CISC instruction. Instruction variants can have different instruction lengths, use different addressing modes, and set or react to various condition codes. A configuration context can establish operating parameters and modes, such as a clock frequency, a number of cores that are active, and a level of multithreading. For each instruction variant, configuration context, and microarchitecture behavior, an instruction profile can be generated to collectively form an instruction set profile. Micro-architecture related information can be derived and used to define a reduced size design space on which a solution (such as max-power, min-power, voltage noise stressmarks) can be exhaustively searched in a practical amount of time.

Additionally, at a system level, a workload database can be defined based on the metrics of interest to profile. Workloads define an amount of processing that is to be performed at the same time, such as instruction sequences to execute. Workloads in the workload database can exhibit different levels of behavior relative to a desired metric of interest when executing, such as a high level, a mid-level, and a low level of the desired metric of interest. All possible workload to core mappings can be run, and the metrics of interest of each run can be gathered to define a database relating the workload mapping to metrics of interest values. A statistical analysis may be applied on gathered experimental data that results from mapping of the workloads to the metrics of interest. A metric of interest profile can be defined based on the statistical analysis.

Figure 1:
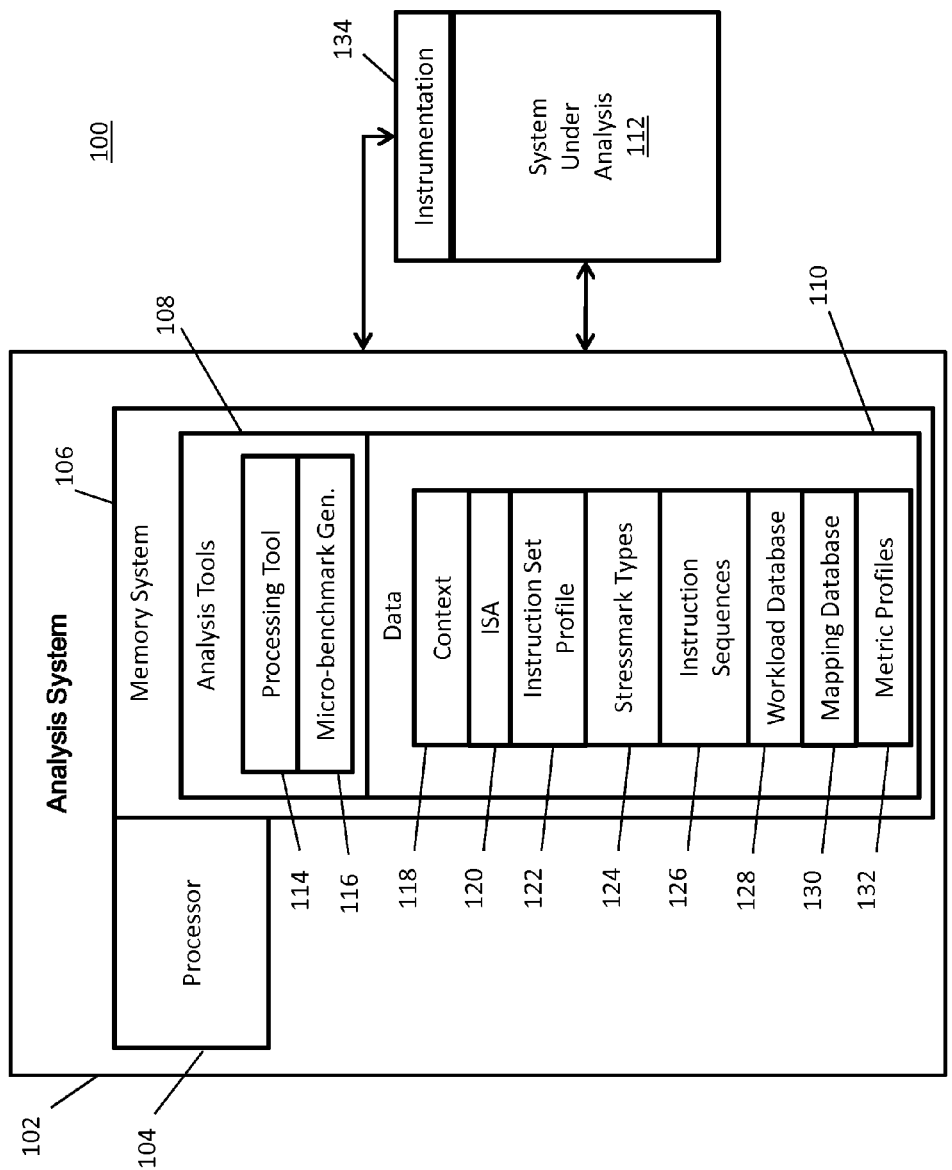
FIG. 1 is an exemplary diagram of an analysis system in which aspects of the exemplary embodiments may be implemented.
Figure 2:
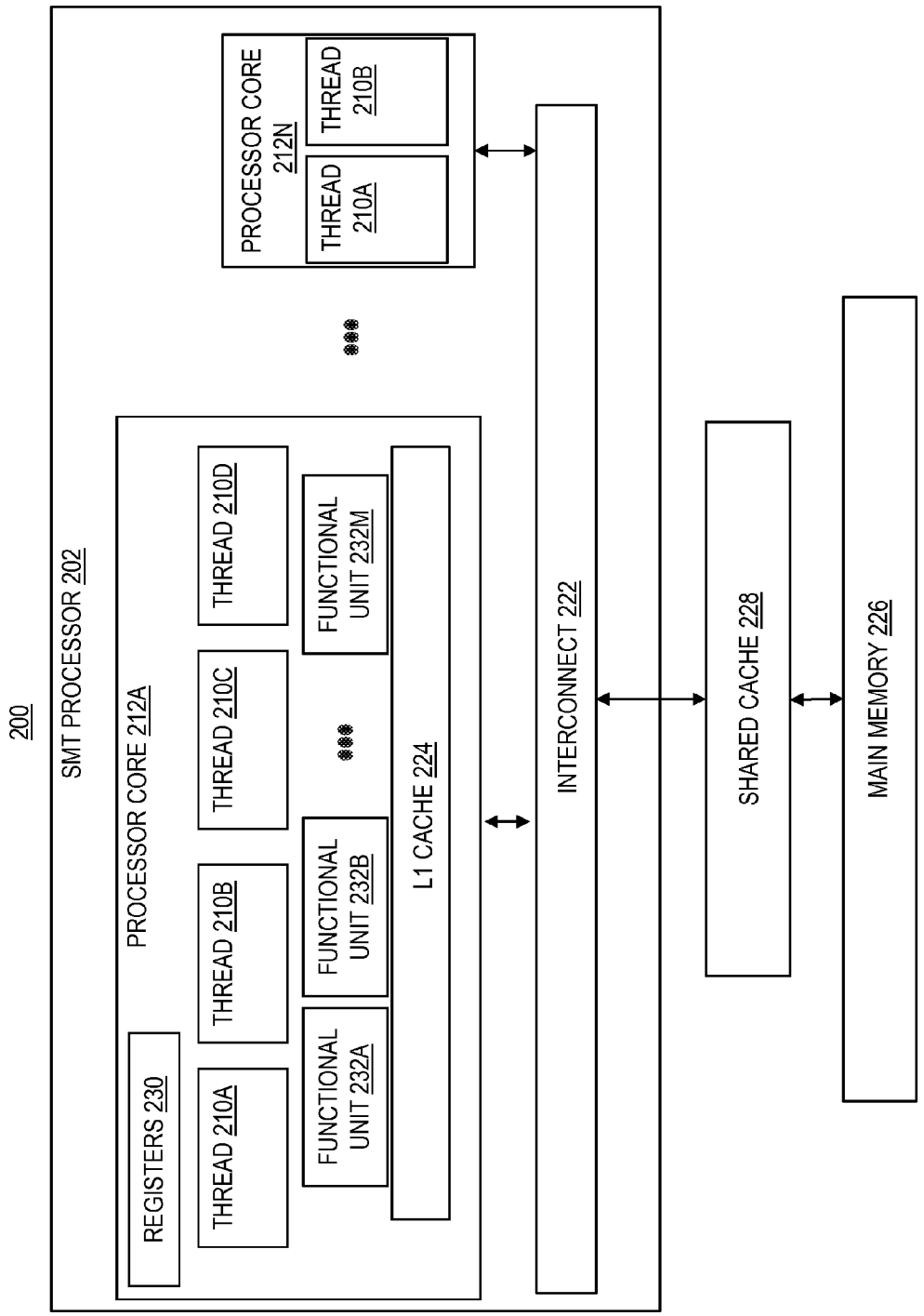
FIG. 2 is an exemplary block diagram of a system under analysis in accordance with an embodiment.

The exemplary embodiments may be implemented for a variety of processors of various computing devices. For example, exemplary embodiments may be used for any of a server computing device, client computing device, communication device, portable computing device, or the like. FIGS. 1-2 are provided hereafter as examples of an analysis system in which exemplary aspects of the illustrative embodiments may be implemented for a system under test. FIGS. 1-2 are only exemplary and are not intended to state or imply any limitation with regard to the types of computing devices in which the illustrative embodiments may be implemented. To the contrary, the exemplary embodiments may be implemented in any processor regardless of the particular machine or computing device in which the processor is ultimately operating.

Turning now to FIG. 1, a system 100 is generally shown that includes an analysis system 102 configured to generate and apply stressmarks on a system under analysis 112. The system under analysis 112 can be a physical system or a simulated system. For example, the system under analysis 112 may be in raw wafer form (that is, as a single wafer that has multiple unpackaged chips), as a bare die, or in a packaged form. In the latter case the system under analysis 112 can be mounted in a single chip package (such as a plastic carrier, with leads that are affixed to a motherboard or other higher level carrier) or in a multichip package (such as a ceramic carrier that has either or both surface interconnections or buried interconnections). The system under analysis 112 may also be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 2 depicts one example of elements that may be incorporated within the system under analysis 112 regardless of physical packaging or level of physical realization.

Continuing with the description of FIG. 1, the analysis system 102 includes a processor 104 and a memory system 106 (also referred to as memory 106). The processor 104 can be any type of processing circuitry or microcontroller, including multiple instances thereof, that is configurable to execute processes further described herein, where the memory system 106 is an example of a tangible storage medium. The memory system 106 can include analysis tools 108 and data 110. The analysis tools 108 may be partitioned as one or more computer program products. For example, the analysis tools 108 can include a processing tool 114 and a micro-benchmark generator 116 among other executable applications (not depicted). The data 110 can include a variety of records, files, and databases, such as a configuration context 118, an instruction set architecture (ISA) 120, an instruction set profile 122, stressmark types 124, instruction sequences 126, a workload database 128, a mapping database 130, metric profiles 132, and other data (not depicted) as further described herein.

In an exemplary embodiment, the processor 104 is coupled to the memory system 106, and the processor 104 is configured to execute the analysis tools 108 to analyze the ISA 120 of the system under analysis 112 and generate the instruction set profile 122 for each architectural instruction variant of the ISA 120. The system under analysis 112 can include at least one CISC processor that is targeted by analysis at the processor or core level to determine a combination of instruction sequences 126 for a targeted CISC processor of the system under analysis 112 from the instruction set profile 122 that corresponds to a desired stressmark type of the stressmark types 124. The desired stressmark type can define a metric representative of functionality of interest of the targeted CISC processor.

The processing tool 114 may orchestrate an analysis process as well as perform pre and post processing operations on data generated by the micro-benchmark generator 116. The micro-benchmark generator 116 can develop benchmark data on a variety of performance metrics and on an instruction basis for an instruction or sequence of instructions. The micro-benchmark generator 116 may operate in a simulation environment that is configured with architecture and performance characteristics of the system under analysis 112 or may directly interface with a physical instance of the system under analysis 112 using instrumentation 134. The instrumentation 134 can include current monitors, voltage monitors, temperature monitors, noise level monitors, and the like.

The processing tool 114 or other portion of the analysis tools 108 can define a set of workloads in the workload database 128 for the system under analysis 112 based on a plurality of metrics of interest to profile. The system under analysis 112 can be a multi-core computer system that is targeted for performance analysis, such as one or more multi-core and multi-threading CISC processors. The results of stressmark analysis for metrics such as power, energy, temperature, instructions-per-cycle, etc. can be used to identify which instruction sequences 126 or combinations of the instruction sequences 126 should be stored in the workload database 128. A plurality of workload-to-core mappings for the workloads can be generated and stored in the mapping database 130 to define which workloads from the workload database 128 should be mapped to particular processor cores in the system under analysis 112 for multiple metrics of interest. Statistical analysis can be applied to a mapping of the workloads to the metrics of interest in the mapping database 130 to define the metric profiles 132 for the system under analysis 112. Further details are provided herein.

FIG. 2 depicts an example of a simultaneous multithreading (SMT) multicore system 200 according to an embodiment of the system under analysis 112 of FIG. 1 as a targeted multi-core computer system. The SMT multicore system 200 can include multiple instances of an SMT processor 202, which is a multi-core CISC processor in this example. FIG. 2 shows many SMT processor cores 212A through 212N (generally referred to as SMT processor cores 212, processor cores 212, or cores 212) on one SMT processor die or SMT processor 202, connected with an interconnect 222, under management of an interconnect control (not shown). Each processor core 212 may have an instruction cache for caching instructions from memory to be executed and a data cache for caching data (operands) of memory locations to be operated on by the processor core 212. In an embodiment, caches of multiple SMT processors 202 are interconnected to support cache coherency between the caches of the multiple SMT processors 202. The processor core 212 caches may include one level of caching in a hierarchical cache structure. For example, each SMT processor 202 may employ a shared cache 228 to be shared among all or a subset of the processor cores 212 on the SMT processor 202 between the SMT processor 202 and main memory 226. Additionally, each processor core 212 may have its own L1 cache 224 directly on the processor core 212, where the L1 cache 224 is not shared among the different processor cores 212 but is a core-internal cache. Also, each processor core 212 may have one or more registers 230 for storing small amounts of data, status, and configuration information.

It is understood that the processor cores 212 are physical devices or simulated instances thereof that include all the circuitry (i.e., hardware along with firmware) necessary to execute instructions as understood by one skilled in the art.

Although the SMT processor 202 may include multiple processor cores 212, various examples may be provided with reference to processor core 212A for ease of understanding and not limitation. It is understood that further details shown and discussed relative to processor core 212A apply by analogy to all processor cores 212, and these details may be included in all of the processor cores 212.

The processor core 212A is shown with four threads 210A, 210B, 210C, and 210D (also referred to as thread0, thread1, thread2, and thread3, and generally referred to as thread or threads 210), and each thread 210A-210D includes a separate sequence of instructions or instruction stream, such as a program or portion thereof that can be provided from the instruction sequences 126 and/or workload database 128 of FIG. 1. Each processor core 212A-212N may be configured to support different levels of SMT, i.e., a different number of threads 210. In the example of FIG. 2, processor core 212A is in SMT-4 mode, meaning that four threads 210A-210D are configured to execute in parallel, while processor core 212N is in SMT-2 mode with threads 210A and 210B. A processor core 212 may be configured in a single thread mode or a higher order mode with a higher number of threads depending upon implementation.

At an architecture level, each thread 210 may represent an independent central processing unit (CPU). Instructions which the thread 210 has for execution by the processor core 212 can include a number of instruction classes, such as: general, decimal, floating-point-support (FPS), binary-floating-point (BFP), decimal-floating-point (DFP), hexadecimal-floating-point (HFP), control, and I/O instructions. The general instructions can be used in performing binary-integer arithmetic operations and logical, branching, and other non-arithmetic operations. The decimal instructions operate on data in decimal format. The BFP, DFP, and HFP instructions operate on data in BFP, DFP, and HFP formats, respectively, while the FPS instructions operate on floating-point data independent of the format or convert from one format to another. To achieve higher throughput, various resource units, such as functional units 232A, 232B, . . . , 232M of each processor core 212 can be accessed in parallel by executing one or more of the instructions in a thread 210 using a processing pipeline and micro-operation sequencing. Functional units 232A-232M can include, for example, one or more fixed-point execution units, floating-point execution units, vector execution units, load/store units, branch control units, and the like.

Figure 3:
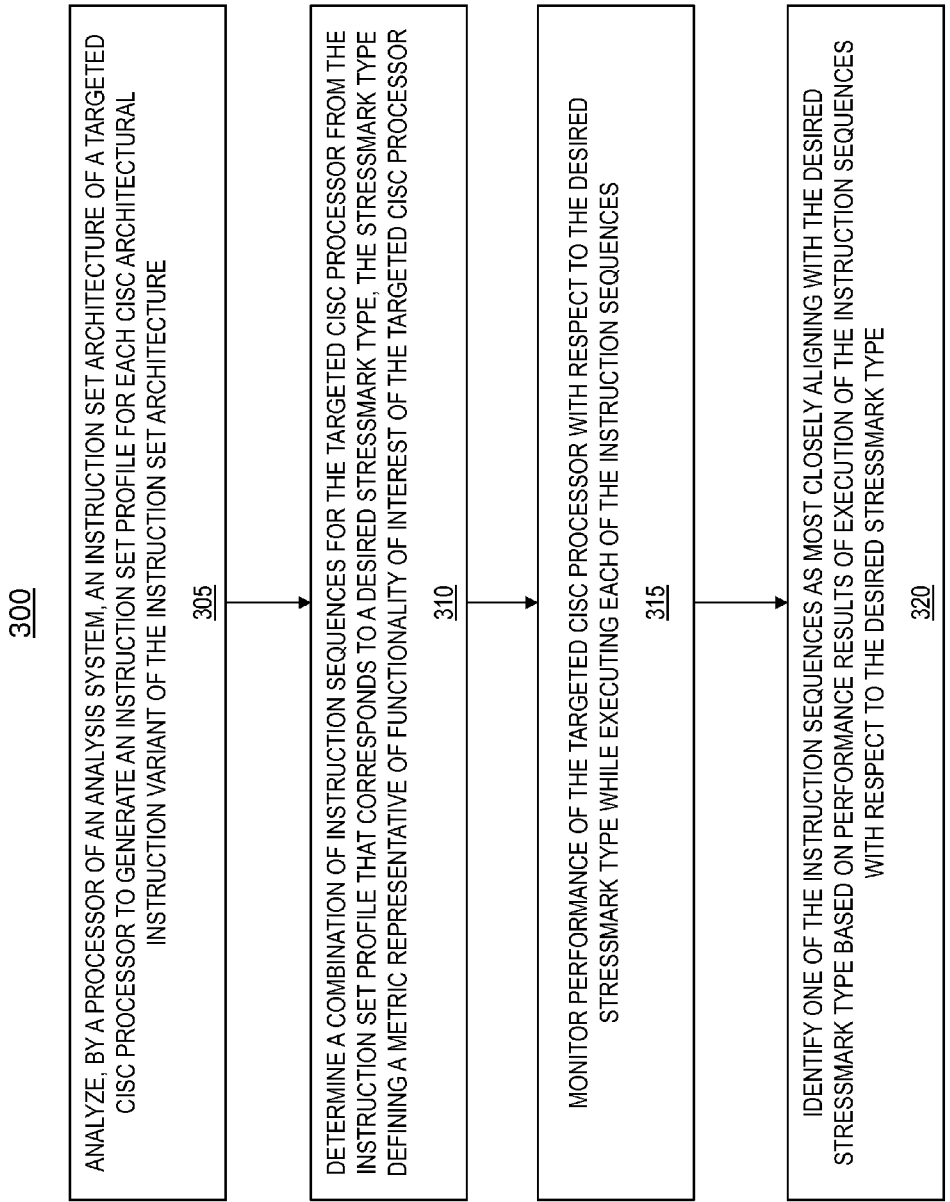
FIG. 3 illustrates a flow diagram of a method for generating and applying stressmarks in a computer system in accordance with an exemplary embodiment.

Referring now to FIG. 3, a flow chart diagram of a method 300 for generating and applying stressmarks in a computer system in accordance with an exemplary embodiment is shown. The example of FIG. 3 is described with respect to the example of FIGS. 1 and 2. As shown at block 305, the method 300 includes analyzing, by the processor 104 of the analysis system 100 of FIG. 1, the ISA 120 FIG. 1 of a targeted CISC processor, such as the SMT processor 202 of FIG. 2, to generate the instruction set profile 122 of FIG. 1 for each CISC architectural instruction variant of the ISA 120. The instruction set profile 122 can be formed by determining variations of each instruction of the ISA 120 based on a microarchitecture behavior and the configuration context 118 of the target CISC processor.

At block 310, a combination of instruction sequences 126 of FIG. 1 is determined for the targeted CISC processor from the instruction set profile 122 that corresponds to a desired stressmark type from the stressmark types 124 of FIG. 1. The desired stressmark type defines a metric representative of functionality of interest of the targeted CISC processor. The combination of instruction sequences 126 can be selected based on the configuration context 118 of the target CISC processor, an instruction sequence length, and one or more properties defined in the instruction set profile 122. The one or more properties may include: an instruction-per-cycle metric, a mapping to functional units 232A-232M of FIG. 2 of the targeted CISC processor, an instruction format type, a number of micro-operations decoded metric, a number of micro-operations dispatched metric, an instruction average power metric, an instruction average temperature metric, a register usage metric, a latency metric, a throughput metric, a group formation metric, a branch direction, a cache hit/miss level, a switching factor, and other such instruction properties known in the art. The properties in the instruction set profile 122 can be generated by the micro-benchmark generator 116 of FIG. 1. In a CISC architecture, variable instruction sizes can be supported and may be processed as instruction groups. Instructions within an instruction group can be tied to a corresponding thread 210 of FIG. 2 and may have dependencies on other instructions that impact efficiency depending upon sequencing. Additionally, instructions-per-cycle and group formation metrics can be impacted when faster instructions are grouped with slower instructions. Switching factors can include the effect of switching inputs and/or outputs at a lower rate, at a higher rate, and/or at a random frequency. Whether a branch is taken or not can impact performance. The use of a branch predictor can also impact performance.

At block 315, performance of the targeted CISC processor is monitored with respect to the desired stressmark type while executing each of the instruction sequences 126. For example, the micro-benchmark generator 116 of FIG. 1 can use the instrumentation 134 of FIG. 1 to monitor the SMT processor 202 of FIG. 2 while executing one or more threads 210 based on the instruction sequences 126. The desired stressmark type of the stressmark types 124 may be one of a power metric, a noise metric, an energy metric, a speed metric, or other metric type. At block 320, one of the instruction sequences 126 is identified as most closely aligning with the desired stressmark type based on performance results of execution of the instruction sequences 126 with respect to the desired stressmark type. For example, upon executing many variations of the instruction sequences 126, metrics for each run can be ranked and sorted, e.g., min power, max power, noise, energy, energy efficiency (e.g., energy per instruction), instructions per cycle, etc.

Figure 4:
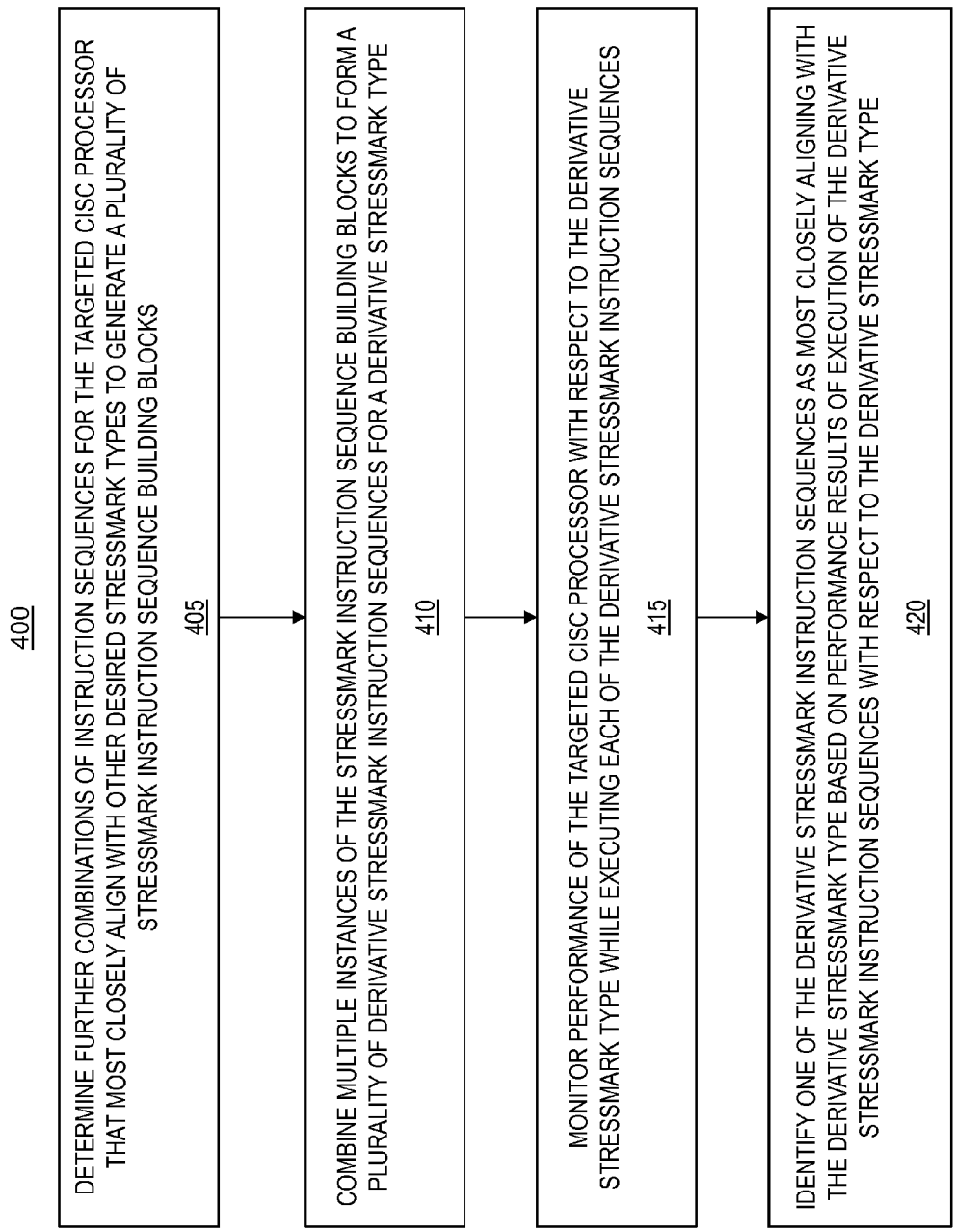
FIG. 4 illustrates a flow diagram of a method for generating and applying a combination of stressmarks in a computer system in accordance with an exemplary embodiment.

Referring now to FIG. 4, a flow chart diagram of a method 400 for generating and applying a combination of stressmarks in a computer system in accordance with an exemplary embodiment is shown. As previously described, the method 300 of FIG. 3 can be run to develop and identify a number of instruction sequences 126 of FIG. 1 that best fit particular stressmark types in the stressmark types 124 of FIG. 1. Further derivative stressmark types can be developed by combining the instruction sequences 126 determined using the method 300 of FIG. 3 and transitioning at different rates, e.g., toggling between a minimum and maximum power at a predetermined rate. As shown at block 405, the method 400 includes determining further combinations of instruction sequences 126 for the targeted CISC processor, such as SMT processor 202 of FIG. 2, that most closely align with other desired stressmark types 124 to generate a plurality of stressmark instruction sequence building blocks, e.g., stressmark types 124 that align to particular instruction sequences 126.

At block 410, multiple instances of the stressmark instruction sequence building blocks are combined to form a plurality of derivative stressmark instruction sequences for a derivative stressmark type. For example, an inductive noise stressmark (dI/dt) can include a combination of the instruction sequences 126 of FIG. 1 for minimum and maximum power switched at a particular frequency.

At block 415, performance of the targeted CISC processor can be monitored with respect to the derivative stressmark type while executing each of the derivative stressmark instruction sequences. For instance, a thread 210 of FIG. 2 can be formed from a combination of the instruction sequences 126 of FIG. 1 that transitions between a lower/higher state, such as a minimum and maximum, and the micro-benchmark generator 116 can use the instrumentation 134 to monitor execution of the thread 210.

At block 420, one of the derivative stressmark instruction sequences is identified as most closely aligning with the derivative stressmark type based on performance results of execution of the derivative stressmark instruction sequences with respect to the derivative stressmark type. A noise monitor of the instrumentation 134 of FIG. 1 can capture noise values while multiple combinations of the instruction sequences 126 are executed as potential min-max pairs, with the results ranked and sorted to identify the highest scoring instruction sequence for the derivative stressmark type of interest.

Figure 5:
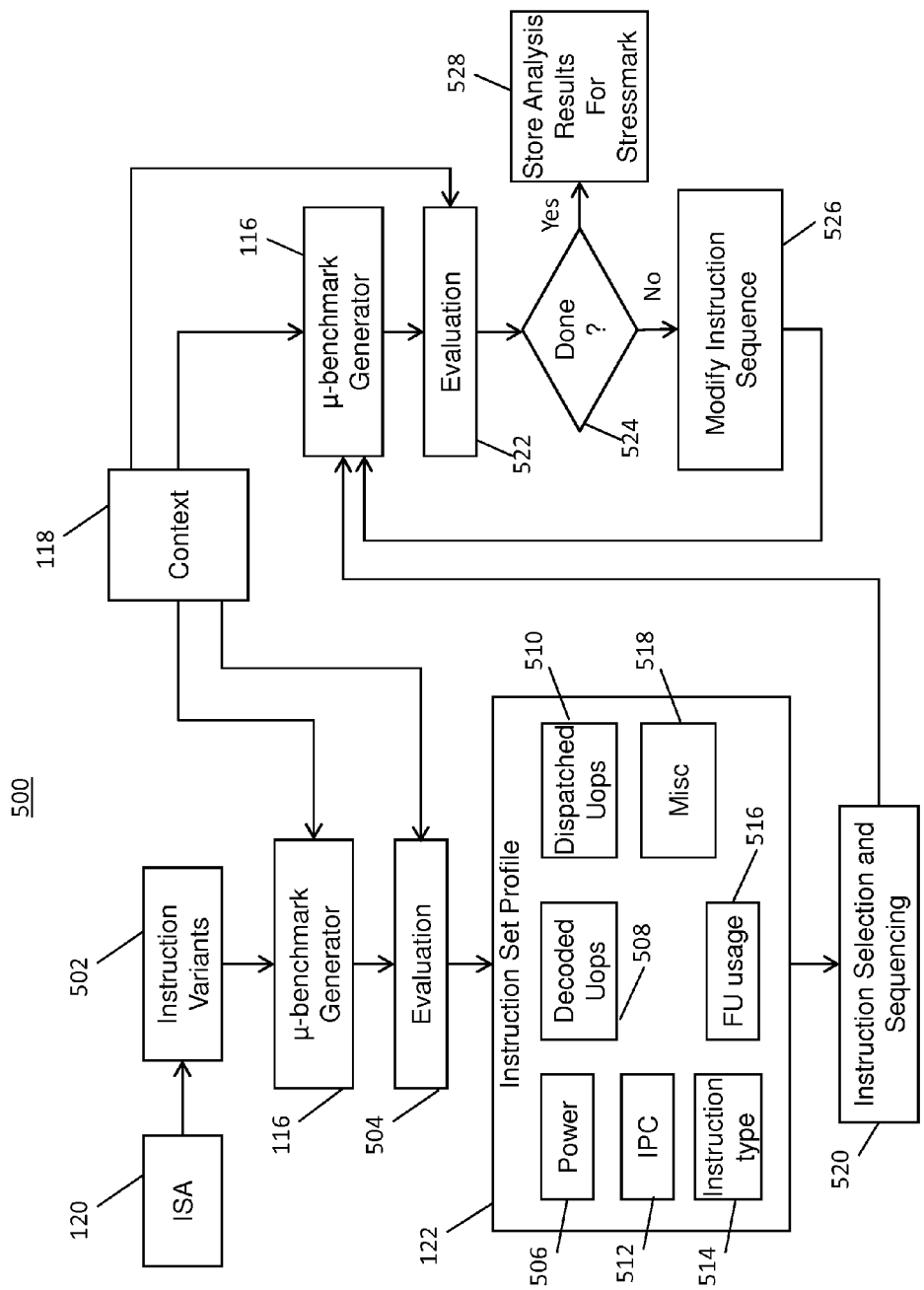
FIG. 5 illustrates another flow diagram of a method for generating and applying stressmarks in a computer system in accordance with an exemplary embodiment.

FIG. 5 illustrates another flow diagram of a method 500 for generating and applying stressmarks in a computer system in accordance with an exemplary embodiment. In FIG. 5, the ISA 120 of FIG. 1 is analyzed to generate instruction variants 502. The instruction variants 502 can include different CISC instruction format types and other variations to generate a substantially complete energy-wise and microarchitecture-wise taxonomy that includes instruction-wise power and instructions-per-cycle formalisms of each instruction variant. The analysis may be performed by the processing tool 114 of FIG. 1. The micro-benchmark generator 116 can analyze the instruction variants 502 in view of the configuration context 118 and provide results for evaluation 504 to populate the instruction set profile 122.

For each instruction of the ISA 120, one or more instruction variants 502 of the instruction can be identified according to a CISC architecture. Each different architecture event that can be generated for the instruction variants 502 may be determined, such as a branch taken/not taken, hits/misses to each memory hierarchy level, ranges of variable micro-operations dispatched per instruction, and the like. Different configuration contexts 118 for execution can be considered, such as changes to an SMT mode of operation, a number of cores enabled, an address mode, and the like. Input/output switching for different factors can be determined, such as a minimum, maximum, and random switching factor. Example properties of the instruction set profile 122 include power 506, a number of decoded micro-operations 508, a number of dispatched micro-operations 510, instructions per cycle 512, instruction type 514, functional unit usage 516, and other miscellaneous properties 518, such as those previously described and further described herein.

The instruction set profile 122 is used for instruction selection and sequencing 520 according to a desired stressmark type to populate the instruction sequences 126 of FIG. 1. For a maximum power stressmark, instruction selection can look for instruction variants in the instruction set profile 122 that maximize a combination of power 506 and instructions per cycle 512 in view of the number of decoded micro-operations 508, the number of dispatched micro-operations 510, instruction type 514, and functional unit usage 516 for the configuration context 118. A sequence length may be selected to reach a maximum group size for maximum power. The resulting instruction sequence from the instruction selection and sequencing 520 can be fed to the micro-benchmark generator 116 along with the configuration context 118 to generate a new group of micro-benchmark results, which in turn are provided for evaluation 522 in view of the configuration context 118. Multiple variations can be explored and initially constrained as staying within a first level of cache, e.g., L1 cache 224 of FIG. 2.

A determination as to whether the analysis is done 524 may check to see if all extended cases have been run, and if not, the instruction sequence can be further modified 526 to insert additional access patterns to further enhance the stressmark type, such as inclusion of instructions that extend access beyond the L1 cache 224 of FIG. 2. For the maximum power stressmark, different load access patterns can be explored to see how various changes impact maximum power, such as changes to a number of streams, stride, and range. Further iterations of the micro-benchmark generator 116 can be performed to explore a store ratio and store access patterns with changes to the number of streams, stride, and range. Additional iterations of the micro-benchmark generator 116 can be performed to explore different branches taken/not taken ratios. Once all of the desired variations are done 524, analysis results for the stressmark can be stored 528. Results can be stored in the instruction sequences 126 of FIG. 1 for later use as a building block for a particular stressmark type.

As other stressmark types are explored, the method 500 of FIG. 5 can be repeated with different criteria. For example, a minimum power stressmark may look for instruction variants in the instruction set profile 122 that minimize a combination of power 506 and instructions per cycle 512 in view of the number of decoded micro-operations 508, the number of dispatched micro-operations 510, instruction type 514, and functional unit usage 516 for the configuration context 118. A minimum sequence length, e.g., a length of one, may be used for the minimum power stressmark. Other variations can be employed depending upon the desired stressmark type. In general, a micro-benchmark can be generated with an endless loop that repeats a sequence of instructions that generates desired microarchitectural activity. The loop can be sized such that the branch effect of looping has a minimal impact with respect to the number of instructions while also low enough to avoid instruction cache misses. The micro-benchmark can be run in a requested context corresponding to the configuration context 118, including multiple copies in parallel.

Figure 6:
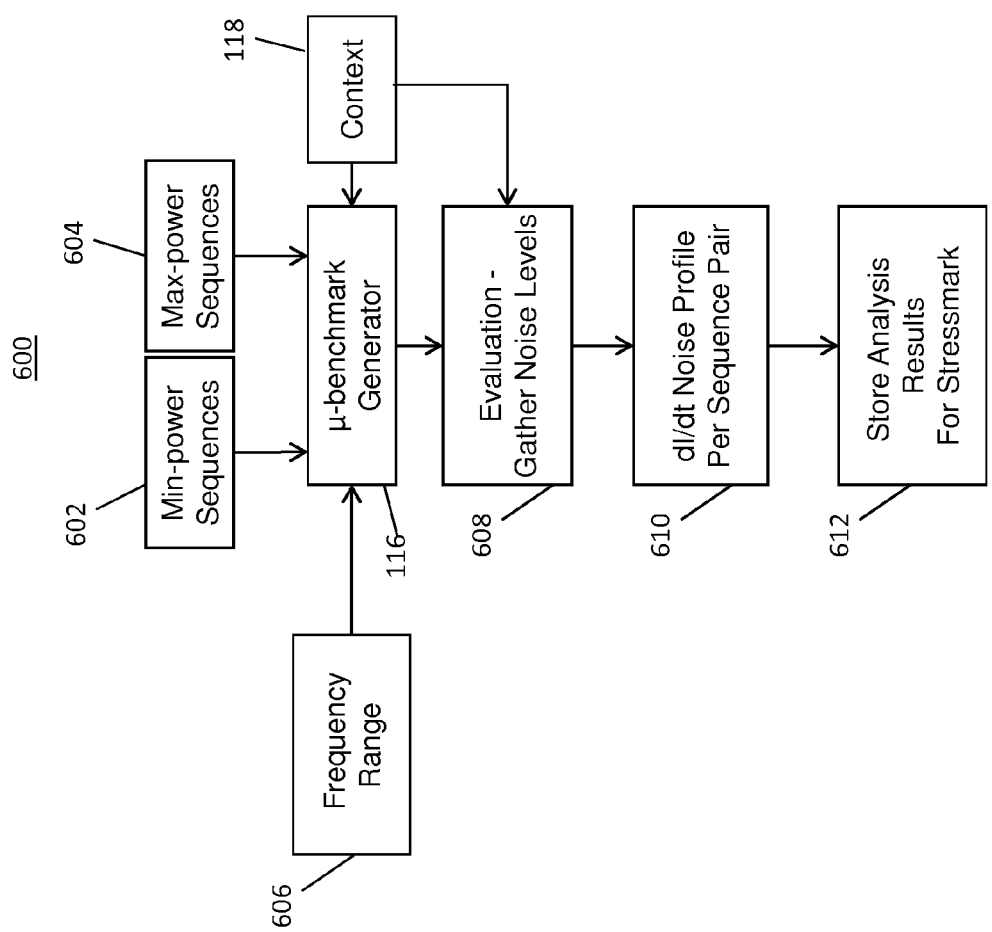
FIG. 6 illustrates a flow diagram of a method for generating and applying a noise stressmark in a computer system in accordance with an exemplary embodiment.

FIG. 6 illustrates a flow diagram of a method 600 for generating and applying a noise stressmark in a computer system in accordance with one exemplary embodiment. The method 500 of FIG. 5 can be used to capture one or more minimum-power instruction sequences 602 for a minimum power stressmark and one or more maximum-power instruction sequences 604 for a maximum power stressmark as building blocks for the method 600. The micro-benchmark generator 116 can receive the minimum-power instruction sequences 602, maximum-power instruction sequences 604, the configuration context 118 and a frequency range 606. The frequency range 606 can identify frequencies for alternating the instruction sequence between the minimum-power instruction sequences 602 and the maximum-power instruction sequences 604. Results are provided for evaluation 608 to gather noise level data. Each building block combination may be considered at a series of frequencies across a spectrum for analysis. For instance, if there are two min-power instruction sequences A and B, and two max-power instruction sequences C and D, the combinations AC, AD, BC, BD can be run across frequency points between 1 Hz to 200 MHz. Noise levels in the SMT processor 202 of FIG. 2 may be gathered using built-in noise level monitors, such as skitter macros, or through instrumentation 134 of FIG. 1 to form an dI/dt inductive noise profile per sequence pair 610. Once a result is identified that best meets the desired stressmark, analysis results for the stressmark can be stored 612, including the actual best performing instruction sequence in the instruction sequences 126 of FIG. 1.

Figure 7:
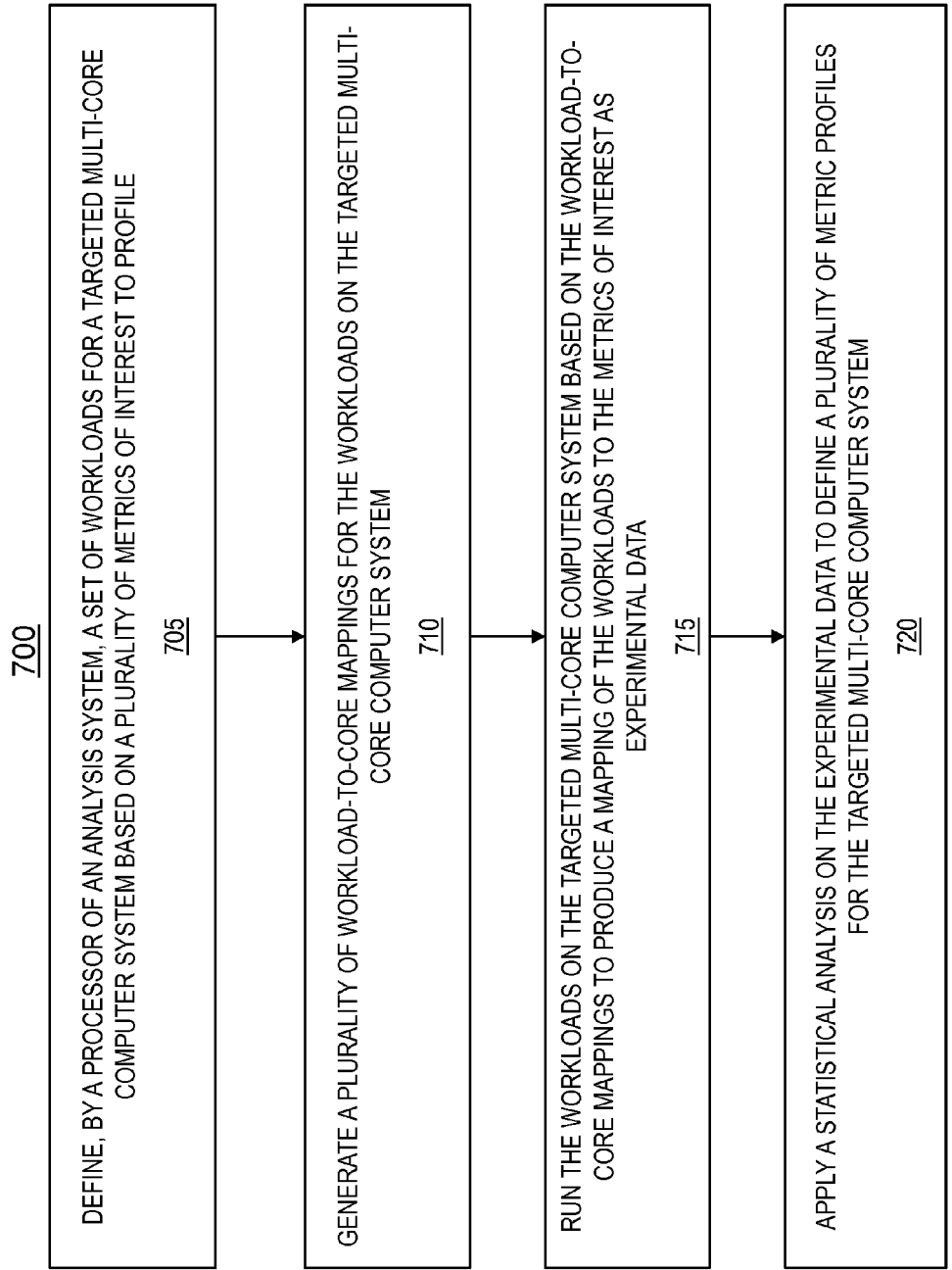
FIG. 7 illustrates a flow diagram of a method for workload-based system analysis in a computer system in accordance with an exemplary embodiment.

Referring now to FIG. 7, a flow chart diagram of a method 700 in accordance with an exemplary embodiment is shown. The method 700 of FIG. 7 is further described in reference to FIGS. 1 and 2. As shown at block 705, the method 700 includes defining, by the processor 104 of the analysis system 100 of FIG. 1, a set of workloads for a targeted multi-core computer system, e.g., the SMT multicore system 200 of FIG. 2, based on a plurality of metrics of interest to profile. The workloads may be defined in the workload database 128 of FIG. 1 and include at least one higher-level stress workload that increases a selected metric of interest while running, at least one lower-level stress workload that decreases the selected metric of interest while running, and at least one mid-level stress workload between the at least one higher-level stress workload and the at least one lower-level stress workload. At block 710, a plurality of workload-to-core mappings is generated for the workloads on the targeted multi-core computer system with respect to the processor cores 212 of FIG. 2.

At block 715, the workloads are run on the targeted multi-core computer system based on the workload-to-core mappings to produce a mapping of the workloads to the metrics of interest as experimental data. The mapping of the workloads to the metrics of interest includes can include the mapping database 130 of FIG. 1 that relates each of the workload-to-core mappings to each of the metrics of interest to profile and stores resulting metric values as the experimental data. The metrics of interest can include one or more of a power metric, a noise metric, an energy metric, a temperature metric, a speed metric, or other metric.

At block 720, a statistical analysis is applied on the experimental data in the mapping database 130 of FIG. 1 to define a plurality of metric profiles 132 of FIG. 1 for the targeted multi-core computer system. The statistical analysis can provide statistical evidence to define one or more of: a global behavior of the metrics of interest; a per-core behavior of the metrics of interest; a plurality of inter-core interactions; a clustered behavior of cores; a plurality of models of the metrics of interest as function of a number of cores, core mapping, and workload type; and one or more interaction between the metrics of interest.

Figure 8:
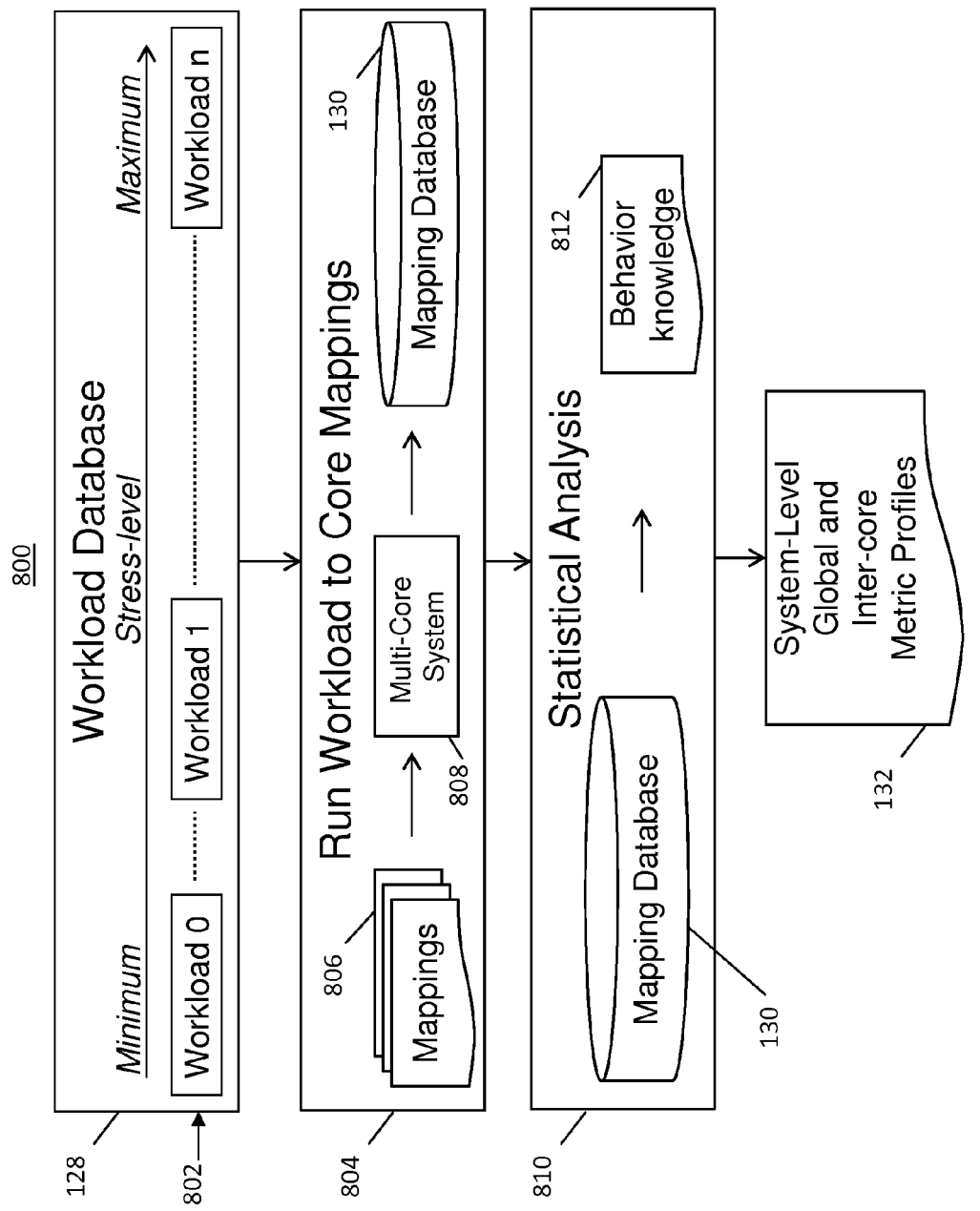
FIG. 8 illustrates another flow diagram of a method for workload-based system analysis in a computer system in accordance with an exemplary embodiment.

FIG. 8 illustrates another flow diagram of a method 800 for workload-based system analysis in a computer system in accordance with an exemplary embodiment. As illustrated in FIG. 8, the workload database 128 provides a plurality of workloads 802 that can range from a lower stress level to a higher stress level. As one example, a minimum workload can be an instruction sequence associated with a minimum stressmark, such as one of the minimum-power instruction sequences 602 of FIG. 6. A maximum workload may expand upon one of the maximum-power instruction sequences 604 of FIG. 6 to include additional system level activities or repeated activity in multiple threads 210 of FIG. 2 and multiple processor cores 212 of FIG. 2. One or more mid-level workloads can be defined between the minimum and maximum workloads.

The workload database 128 can provide input to run workload to core mappings 804. Running workload to core mappings 804 can include a combination of mappings 806 that pair the workloads 802 with a definition of the multi-core system 808 according to the configuration context 118 of FIG. 1. The workload-to-core mappings can be captured in the mapping database 130, with results of running summarized as experimental data. Results can explore all possible workload and core combinations as bounded by the number of processor cores 212 of FIG. 2 and the number of workloads 802 defined in the workload database 128. Statistical analysis 810 is applied to the mapping database 130 to determine behavior knowledge 812. For example, trends or patterns may become apparent over a number of combinations that relate temperature to layout or power to certain sequences or combinations within the SMT multicore system 200 of FIG. 2. System-level global and inter-core metric profiles can be captured in metric profiles 132.

Figure 9:
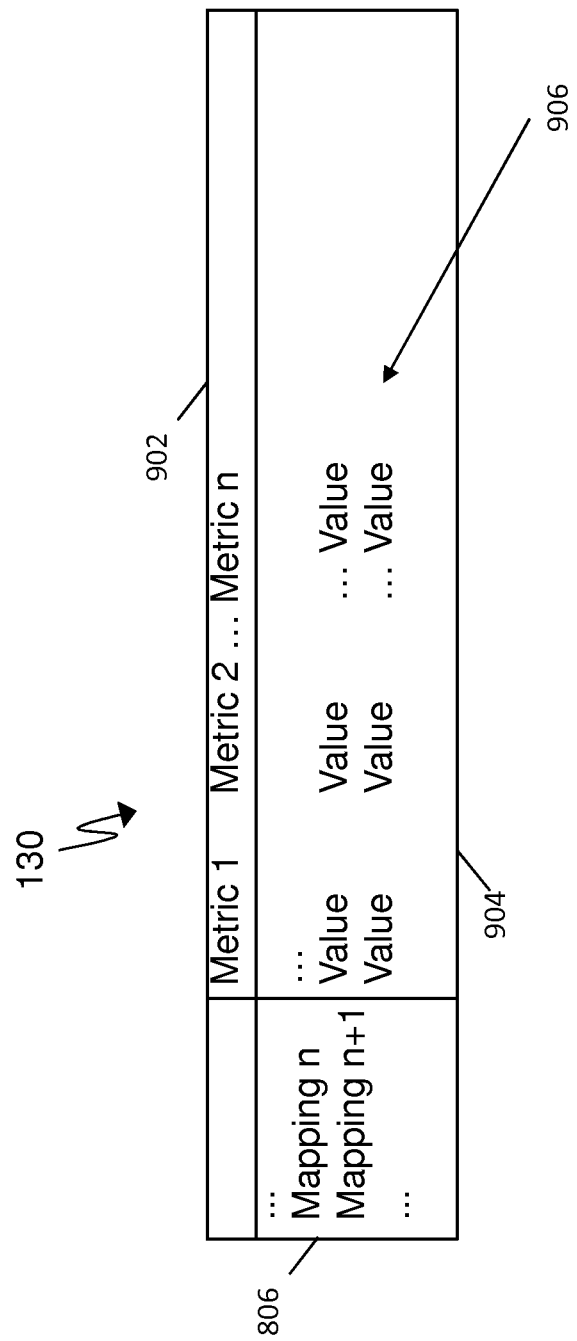
FIG. 9 illustrates an example of data that can be stored in a mapping database in accordance with an exemplary embodiment.

FIG. 9 illustrates an example of data that can be stored in the mapping database 130 of FIG. 1 in accordance with an exemplary embodiment. As depicted in FIG. 9, the mapping database 130 can define a list of the mappings 806 and metrics of interest 902, with resulting values 904 captured as experimental data 906 in the mapping database 130. While this is one example configuration of the mapping database 130, it will be understood that multiple other configuration options are contemplated within the scope of various embodiments as described herein.

Technical effects and benefits include generation and application of stressmarks in a CISC processing system. Instruction sequences that produce desired stressmarks can be determined analytically such that the performance of a system under analysis can be better understood at the processor or system level. Understanding of stressmark performance and the effects of various workloads can give designers insight into potential areas for modification during packaging and system layout to improve processing system performance. Analysis may be performed with respect to an existing system or a simulated system under development. Setting stressmarks to corner conditions can establish worst case conditions for stress testing a system or toggling between stressmarks to analyze derivative stressmarks.

It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. A computer system comprising:
a memory comprising a definition of an instruction set architecture of a targeted complex-instruction set computer (CISC) processor; and
a processor operably coupled to the memory and configured to perform a method comprising:
analyzing the instruction set architecture of the targeted CISC processor to generate an instruction set profile for each CISC architectural instruction variant of the instruction set architecture;
determining a combination of instruction sequences for the targeted CISC processor from the instruction set profile that corresponds to a desired stressmark type, the desired stressmark type defining a metric representative of functionality of interest of the targeted CISC processor;
monitoring performance of the targeted CISC processor with respect to the desired stressmark type while executing each of the instruction sequences;
identifying one of the instruction sequences as most closely aligning with the desired stressmark type based on performance results of execution of the instruction sequences with respect to the desired stressmark type; and
designing and fabricating the targeted CISC processor based on results of the identified one of the instruction sequences most closely aligning with the desired stressmark type.

2. The computer system of claim 1, wherein the instruction set profile is formed by determining variations of each instruction of the instruction set architecture based on a microarchitecture behavior and a configuration context of the target CISC processor.

3. The computer system of claim 2, wherein the combination of instruction sequences is selected based on the configuration context of the target CISC processor, an instruction sequence length, and one or more properties defined in the instruction set profile comprising: an instruction-per-cycle metric, a mapping to functional units of the targeted CISC processor, an instruction format type, a number of micro-operations decoded metric, a number of micro-operations dispatched metric, an instruction average power metric, an instruction average temperature metric, a register usage metric, a latency metric, a throughput metric, a group formation metric, a branch direction, a cache hit/miss level, and a switching factor.

4. The computer system of claim 1, wherein the desired stressmark type is one of: a power metric, a noise metric, an energy metric, or a speed metric.

5. The computer system of claim 1, wherein the processor is further configured to perform:
   determining further combinations of instruction sequences for the targeted CISC processor that most closely align with other desired stressmark types to generate a plurality of stressmark instruction sequence building blocks;
   combining multiple instances of the stressmark instruction sequence building blocks to form a plurality of derivative stressmark instruction sequences for a derivative stressmark type;
   monitoring performance of the targeted CISC processor with respect to the derivative stressmark type while executing each of the derivative stressmark instruction sequences; and
   identifying one of the derivative stressmark instruction sequences as most closely aligning with the derivative stressmark type based on performance results of execution of the derivative stressmark instruction sequences with respect to the derivative stressmark type.

6. A computer program product comprising:
   a computer readable storage medium having computer readable program code embodied therewith, the computer readable program code comprising:
   computer readable program code configured for:
   analyzing, by a processor of an analysis system, an instruction set architecture of a targeted complex-instruction set computer (CISC) processor to generate an instruction set profile for each CISC architectural instruction variant of the instruction set architecture;
   determining a combination of instruction sequences for the targeted CISC processor from the instruction set profile that corresponds to a desired stressmark type, the desired stressmark type defining a metric representative of functionality of interest of the targeted CISC processor;
   monitoring performance of the targeted CISC processor with respect to the desired stressmark type while executing each of the instruction sequences;
   identifying one of the instruction sequences as most closely aligning with the desired stressmark type based on performance results of execution of the instruction sequences with respect to the desired stressmark type; and
   designing and fabricating the targeted CISC processor based on results of the identified one of the instruction sequences most closely aligning with the desired stressmark type.

7. The computer program product of claim 6, wherein the instruction set profile is formed by determining variations of each instruction of the instruction set architecture based on a microarchitecture behavior and a configuration context of the target CISC processor.

8. The computer program product of claim 7, wherein the combination of instruction sequences is selected based on the configuration context of the target CISC processor, an instruction sequence length, and one or more properties defined in the instruction set profile comprising: an instruction-per-cycle metric, a mapping to functional units of the targeted CISC processor, an instruction format type, a number of micro-operations decoded metric, a number of micro-operations dispatched metric, an instruction average power metric, an instruction average temperature metric, a register usage metric, a latency metric, a throughput metric, a group formation metric, a branch direction, a cache hit/miss level, and a switching factor.

9. The computer program product of claim 6, wherein the desired stressmark type is one of: a power metric, a noise metric, an energy metric, or a speed metric.

10. The computer program product of claim 6, wherein the computer readable program code is further configured for:
    determining further combinations of instruction sequences for the targeted CISC processor that most closely align with other desired stressmark types to generate a plurality of stressmark instruction sequence building blocks;
    combining multiple instances of the stressmark instruction sequence building blocks to form a plurality of derivative stressmark instruction sequences for a derivative stressmark type;
    monitoring performance of the targeted CISC processor with respect to the derivative stressmark type while executing each of the derivative stressmark instruction sequences; and
    identifying one of the derivative stressmark instruction sequences as most closely aligning with the derivative stressmark type based on performance results of execution of the derivative stressmark instruction sequences with respect to the derivative stressmark type.

* * * * *